United States Patent
Chen (10) Patent No.: US 9,543,035 B2
(45) Date of Patent: Jan. 10, 2017

(54) TRANSMISSION ERROR DETECTOR FOR FLASH MEMORY CONTROLLER

(75) Inventor: Tsan Lin Chen, Zhubei (TW)

(73) Assignee: HGST TECHNOLOGIES SANTA ANA, INC., Santa Ana, CA (US)

( * ) Notice: Subject to any disclaimer, the term of this patent is extended or adjusted under 35 U.S.C. 154(b) by 162 days.

(21) Appl. No.: 13/420,970

(22) Filed: Mar. 15, 2012

(65) Prior Publication Data

US 2013/0124931 A1    May 16, 2013

Related U.S. Application Data

(60) Provisional application No. 61/559,804, filed on Nov. 15, 2011.

(51) Int. Cl.
| | |
|---|---|
| *G11C 29/00* | (2006.01) |
| *G11C 16/34* | (2006.01) |
| *H04L 12/26* | (2006.01) |
| *G11C 29/04* | (2006.01) |
| *G11C 29/44* | (2006.01) |

(52) U.S. Cl.
CPC ............. *G11C 16/349* (2013.01); *G11C 29/82* (2013.01); *G11C 2029/0409* (2013.01); *G11C 2029/4402* (2013.01); *H04L 43/0847* (2013.01)

(58) Field of Classification Search
USPC ................................................. 714/763, 773
See application file for complete search history.

(56) References Cited

U.S. PATENT DOCUMENTS

| | | | | |
|---|---|---|---|---|
| 4,360,917 | A * | 11/1982 | Sindelar et al. | 714/805 |
| 7,292,785 | B2 * | 11/2007 | Tomooka et al. | 398/58 |
| 2002/0016942 | A1 * | 2/2002 | MacLaren et al. | 714/718 |
| 2004/0139374 | A1 * | 7/2004 | Meaney et al. | 714/48 |
| 2009/0199056 | A1 * | 8/2009 | Murata | 714/704 |
| 2012/0017139 | A1 * | 1/2012 | Otsuka | 714/773 |

* cited by examiner

*Primary Examiner* — M. Mujtaba Chaudry
(74) *Attorney, Agent, or Firm* — Wilmer Cutler Pickering Hale and Dorr LLP (57) ABSTRACT

In one aspect, the present disclosure provides a storage device for accounting for transmission errors to improve a usable life span of memory blocks. In some embodiments, the storage device includes: a memory array including a plurality of memory blocks; and a memory controller in communication with the memory array via an interface, wherein the memory controller is configured to detect an error event associated with data from one of the plurality of memory blocks; determine an origin of the error event; increment an error count if the origin of the error event indicates a data error in the one of the plurality of memory blocks and not if the origin of the error event indicates a transmission error; compare the error count to a threshold value; and mark the one of the plurality of memory blocks as bad when the error count exceeds the threshold value.

16 Claims, 8 Drawing Sheets

TRANSMISSION ERROR DETECTOR FOR FLASH MEMORY CONTROLLER

CROSS-REFERENCE TO RELATED APPLICATION

This application claims the benefit under 35 U.S.C. §119(e) of Provisional Application Ser. No. 61/559,804, filed Nov. 15, 2011, entitled Transmission Error Detector for Flash Memory Controller, the contents of which are incorporated by reference herein.

FIELD OF THE DISCLOSURE

The present disclosure relates generally to the field of semiconductor non-volatile data storage system architectures and methods of operation thereof.

BACKGROUND OF THE DISCLOSURE

A common application of flash memory devices is as a mass data storage subsystem for electronic devices. Such subsystems may be implemented as either removable memory cards that may be inserted into multiple host systems or as non-removable embedded storage within the host system. In both implementations, the subsystem may include one or more flash devices and a flash memory controller.

Flash memory devices are composed of one or more arrays of transistor cells, with each cell capable of non-volatile storage of one or more bits of data. Accordingly, flash memory does not require power to retain data programmed therein. These arrays of cells are partitioned into groups to provide efficient implementation of read, program and erase functions. A typical flash memory architecture for mass storage arranges groups of cells into blocks, wherein a block contains the smallest number of cells that are erasable at one time. Because a block may contain multiple cells, each block may store multiple data units.

The overall storage capacity of flash memory devices may be diminished by bad blocks. A bad block is a block on a computer storage that cannot be used because of damage to the block. Causes of bad blocks include failed flash memory transistors, physical damage to the flash memory surface, and sectors being stuck in a digital state that cannot be reversed. When a bad block is detected, the block is marked as bad and the operating system discontinues use of the bad blocks for future file operations, such as reading and writing files. When the firmware of a flash memory controller finds a block to be bad, the flash memory controller marks the block as bad, and remaps the logical block to a different physical block. The result of marking a block as bad is that the block is no longer used by the flash memory system or by the operating system.

Flash memory systems contain an interface for sending data between a flash memory array and the flash memory controller. This interface is often low-speed, because access speeds for the underlying data stored on a flash memory array are slow. As the interface speed increases to conform with increasing data access speeds, these high-speed interfaces may introduce transient or intermittent errors caused by the transmission channel, which are not errors in the underlying data. These transient or intermittent errors can cause flash memory controllers to mark good blocks as bad prematurely in response to transmission errors.

SUMMARY OF THE DISCLOSURE

In one aspect, the present disclosure provides a storage device for accounting for transmission errors to improve a usable life span of memory blocks. In some embodiments, the storage device includes: a memory array including a plurality of memory blocks; and a memory controller in communication with the memory array via an interface, wherein the memory controller is configured to detect an error event associated with data from one of the plurality of memory blocks; determine an origin of the error event; increment an error count if the origin of the error event indicates a data error in the one of the plurality of memory blocks and not if the origin of the error event indicates a transmission error; compare the error count to a threshold value; and mark the one of the plurality of memory blocks as bad when the error count exceeds the threshold value.

In some embodiments, the memory controller is configured to detect the error event by determining an initial error code based on said data from the one of the plurality of memory blocks; determining a new error code based on said data from the one of the plurality of memory blocks; comparing the new error code with the initial error code; and indicating that an error event occurred if the initial error code differs from the new error code.

In some embodiments, the memory controller is configured to determine the origin of the error event by determining a type of the interface; and if the interface is a high-speed interface; determining the origin of the error event to be the interface; and determining the origin of the error event indicates a transmission error; otherwise; determining the origin of the error event to be the memory array; and determining the origin of the error indicates a data error.

In some embodiments, the memory controller is configured to store the initial error code with said data in the one of the plurality of memory blocks.

In some embodiments, the memory controller is configured to generate the initial error code when said data is requested to be read from the one of the plurality of memory blocks.

In some embodiments, the memory controller is configured to request retransmission of said data if the origin of the error event indicates a transmission error.

In some embodiments, the memory controller is configured to correct said data if the initial error code was created according to an error correction algorithm.

In some embodiments, the memory controller is configured to determine at least one of the initial error code and the new error code based on a cyclic redundancy check algorithm.

In some embodiments, the interface is at least one of a low-speed interface and a high-speed interface.

In some embodiments, the high-speed interface transmits data at speeds greater than two hundred megabytes per second.

In one aspect, the present disclosure provides a method for accounting for transmission errors to improve a usable life span of memory blocks. In some embodiments, the method includes: detecting an error event associated with data transmitted via an interface from one of a plurality of memory blocks in a memory array; determining an origin of the error event; incrementing an error count if the origin of the error event indicates a data error in the one of the plurality of memory blocks and not if the origin of the error event indicates a transmission error; comparing the error count to a threshold value; and marking the one of the plurality of memory blocks as bad when the error count exceeds the threshold value.

In some embodiments, the detecting the error event includes determining an initial error code based on said data from the one of the plurality of memory blocks; determining a new error code based on said data from the one of the plurality of memory blocks; comparing the new error code and the initial error code; and indicating that an error event occurred if the initial error code differs from the new error code.

In some embodiments, the determining the origin of the error event includes determining a type of the interface; and if the interface is a high-speed interface; determining the origin of the error event to be the interface; and determining the origin of the error event indicates a transmission error; otherwise; determining the origin of the error event to be the memory array; and determining the origin of the error indicates a data error.

In some embodiments, the initial error code is stored with said data in the one of the plurality of memory blocks.

In some embodiments, the initial error code is generated when said data is requested to be read from the one of the plurality of memory blocks.

In some embodiments, the method further includes requesting retransmission of said data if the origin of the error event indicates a transmission error.

In some embodiments, the method further includes correcting said data if the initial error code was created according to an error correction algorithm.

In some embodiments, at least one of the initial error code and the new error code is determined based on a cyclic redundancy check algorithm.

In some embodiments, the interface is at least one of a low-speed interface and a high-speed interface.

In some embodiments, the high-speed interface transmits data at speeds greater than two hundred megabytes per second.

BRIEF DESCRIPTION OF THE DRAWINGS

Various objects, features, and advantages of the present disclosure can be more fully appreciated with reference to the following detailed description when considered in connection with the following drawings, in which like reference numerals identify like elements. The following drawings are for the purpose of illustration only and are not intended to be limiting of the invention, the scope of which is set forth in the claims that follow.

DETAILED DESCRIPTION OF THE DISCLOSURE

The present system responds to an error event by determining the origin of the event to indicate a transmission error rather than a data error, and refraining from marking a block as bad based on that transmission error event. The present system improves the overall storage capacity and lifespan of flash memory devices by lowering the number of good blocks prematurely marked as bad.

Figure 1:
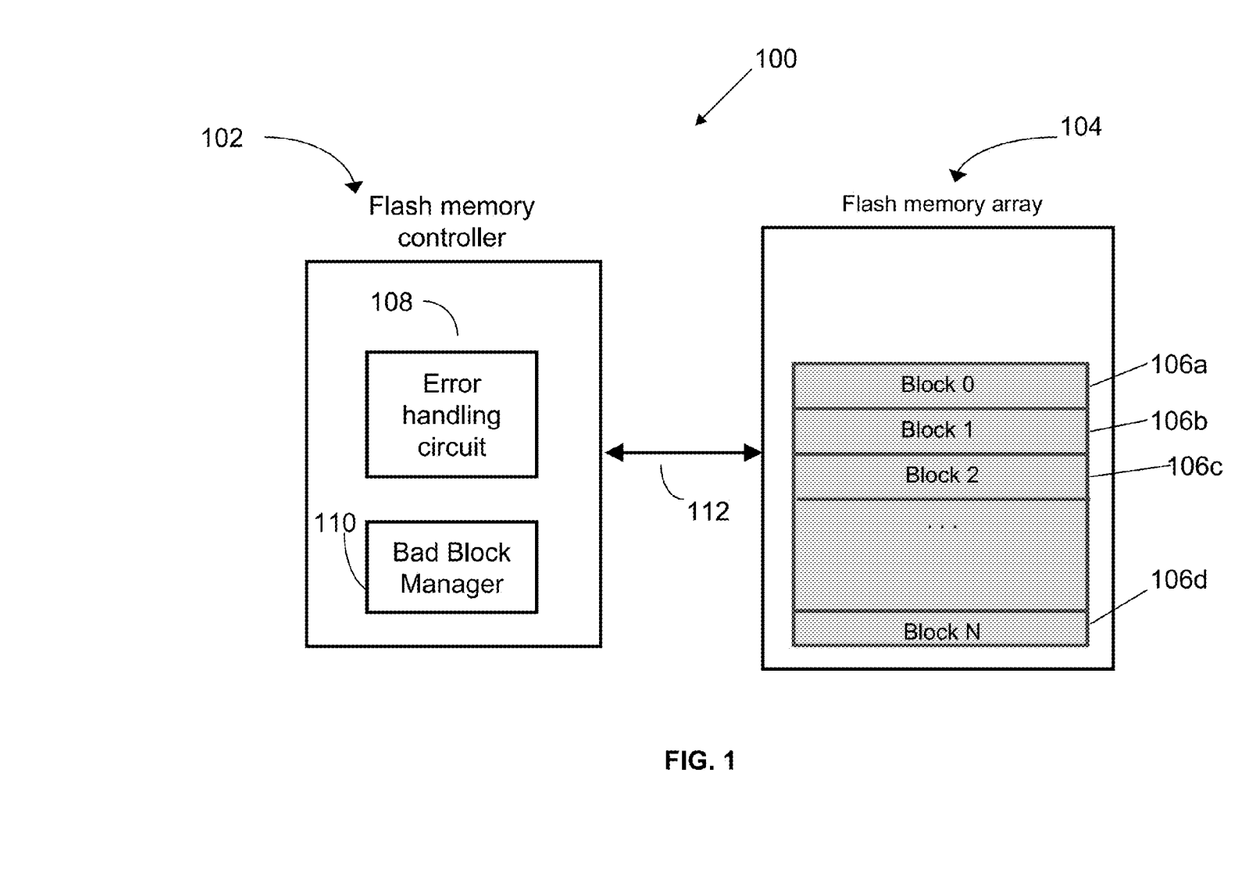
FIG. 1 illustrates a block diagram of hardware components of a flash memory system, according to some embodiments of the present disclosure.

FIG. 1 illustrates a block diagram of main hardware components of a flash memory system 100, according to some embodiments of the present disclosure. FIG. 1 includes flash memory system 100, flash memory controller 102, flash memory array 104, flash memory blocks 106a-d, error handling circuit 108, bad block manager 110, and interface 112. Memory controller 102 uses error handling circuit 108 to manage flash memory array 104 of blocks 106a-106d. Blocks 106a-106d are labeled Block 0 through Block N. Memory controller 102 uses error handling circuit 108 to detect error events in data read and transmitted over interface 112. For example, error handling circuit 108 might detect an error event in response to a flipped bit in the read data. If the stored data is "1011" and error handling circuit 108 receives data "1001," error handling circuit 108 detects an error event. Error handling circuit 108 may be implemented as a hardware circuit embedded in flash memory controller 102, or as firmware or software stored in memory and implemented in flash memory controller 102.

Generally, error events come in two forms: (1) events caused by data errors, and (2) events caused by transmission errors. Data errors correspond to errors in underlying data stored in blocks 106a-106d. Data errors may result in a "0" bit erroneously being read even though the previously stored bit was a "1." Transmission errors correspond to errors introduced by transmission of data over an interface such as interface 112. The data read from one of blocks 106a-106d may have no underlying issues, meaning that retrying a transmission may fix a transient transmission error. Transmission errors may result in bit flips such as transmitting a "1" when underlying data is a "0," or transmitting a "0" when underlying data is a "1." In other words, data errors may result in a "0" bit erroneously being read, and transmission errors may result in "0" or "1" bits erroneously being received.

Bad block manager 110 marks and tracks bad blocks in response to error events. Similarly to error handling circuit 108, bad block manager 110 may be implemented as a hardware circuit embedded in flash memory controller 102, or as firmware or software stored in memory and implemented in flash memory controller 102.

Figure 2:
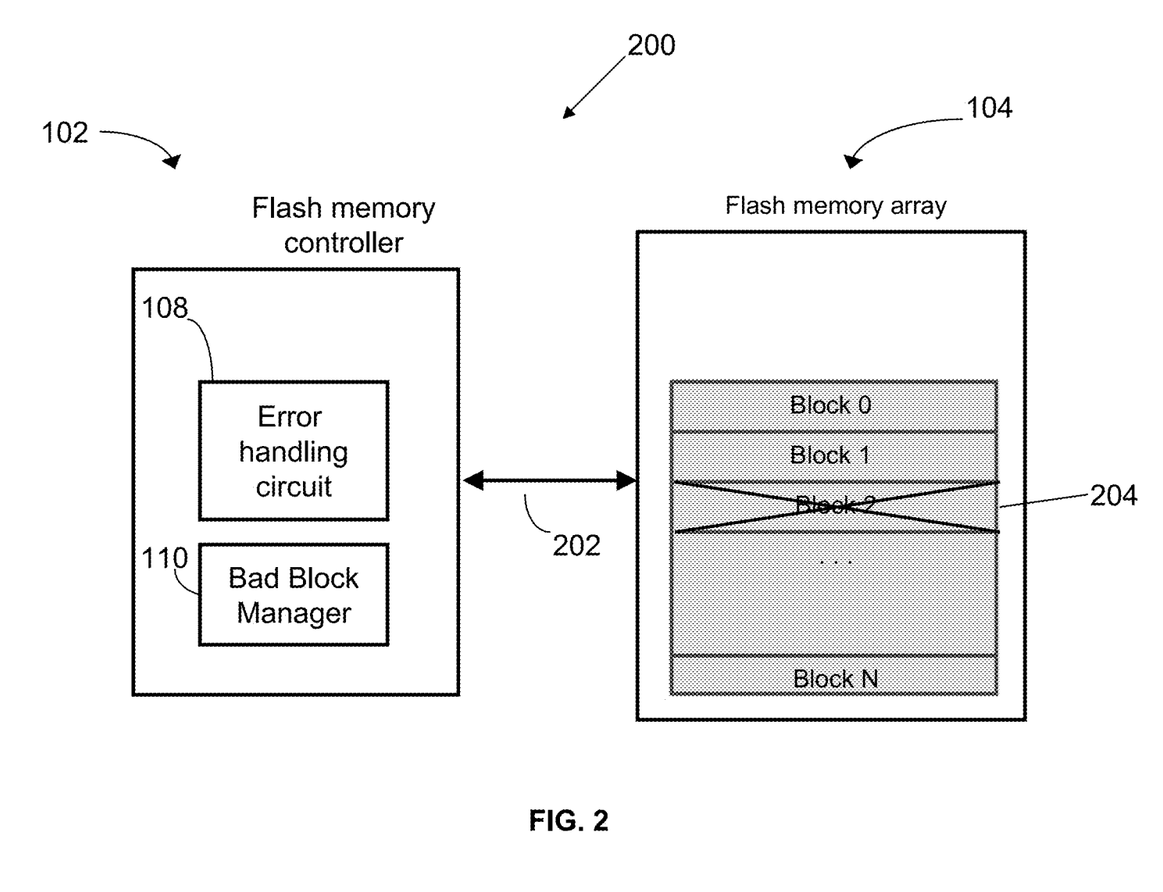
FIG. 2 illustrates a block diagram of a system for responding to an error event in a flash memory system over a low-speed interface, according to some embodiments of the present disclosure.

FIG. 2 illustrates a block diagram of a system 200 for responding to an error event in a flash memory system over a low-speed interface, according to some embodiments of the present disclosure. FIG. 2 includes, with reference to FIG. 1, flash memory controller 102, flash memory array 104, error handling circuit 108, bad block manager 110, low-speed interface 202, and bad block 204 inside the flash memory array.

By way of non-limiting example, low-speed legacy interfaces are generally limited to speeds of 50 megabytes per second (MB/s), according to the ONFI (Open NAND Flash Interface Working Group) NAND interface specification version 1.0. In contrast, the ONFI specification on asynchronous flash memory allows high-speed interfaces to reach speeds of up to 200 MB/s in NAND interface specification version 2.1 and 400 MB/s in NAND interface specification version 3.0. The ONFI Block Abstracted NAND specification revision 1.1 allows high-speed source synchronous interfaces providing up to five times greater bandwidth compared with traditional asynchronous NAND interfaces. At the time of writing, the above speeds correspond to high- and low-speed interfaces. However, as technology improves, it is assumed that the speed of the high-speed interface will continue to increase.

Generally, low-speed interfaces introduce fewer errors when transmitting data than high-speed interfaces. Data sent from one end of a low-speed interface can generally be assumed to be the same as data received at the other end of the interface. Accordingly, when data is transmitted over a low-speed interface such as low-speed interface 202, most error events detected by error handling circuit 108 occur inside flash memory array 104, and do not result from transmission across low-speed interface 202. Over a low-speed interface, flash memory controller 102 assumes that an error event detected by error handling circuit 108 originated inside flash memory array 104. If the assumption is true and the error event in fact originated inside flash memory array 104, memory controller 102 correctly determines that Block 2 (204) should no longer be used to store or read data reliably. Accordingly, when error handling circuit 108 detects an error in Block 2 (204), and the detection results in a total error count increasing over a threshold value, bad block manager 110 marks Block 2 (204) as bad, and tracks Block 2 (204) as a bad block so that flash memory controller 102 does not write to or read from Block 2 (204) in the future. As a result, flash memory controller 102 and the operating system running on the host in communication with flash memory controller 102 no longer use Block 2 to store or read data. The storage capacity and overall flash memory lifespan are diminished because the total number of good blocks available for storage has decreased.

Figure 3:
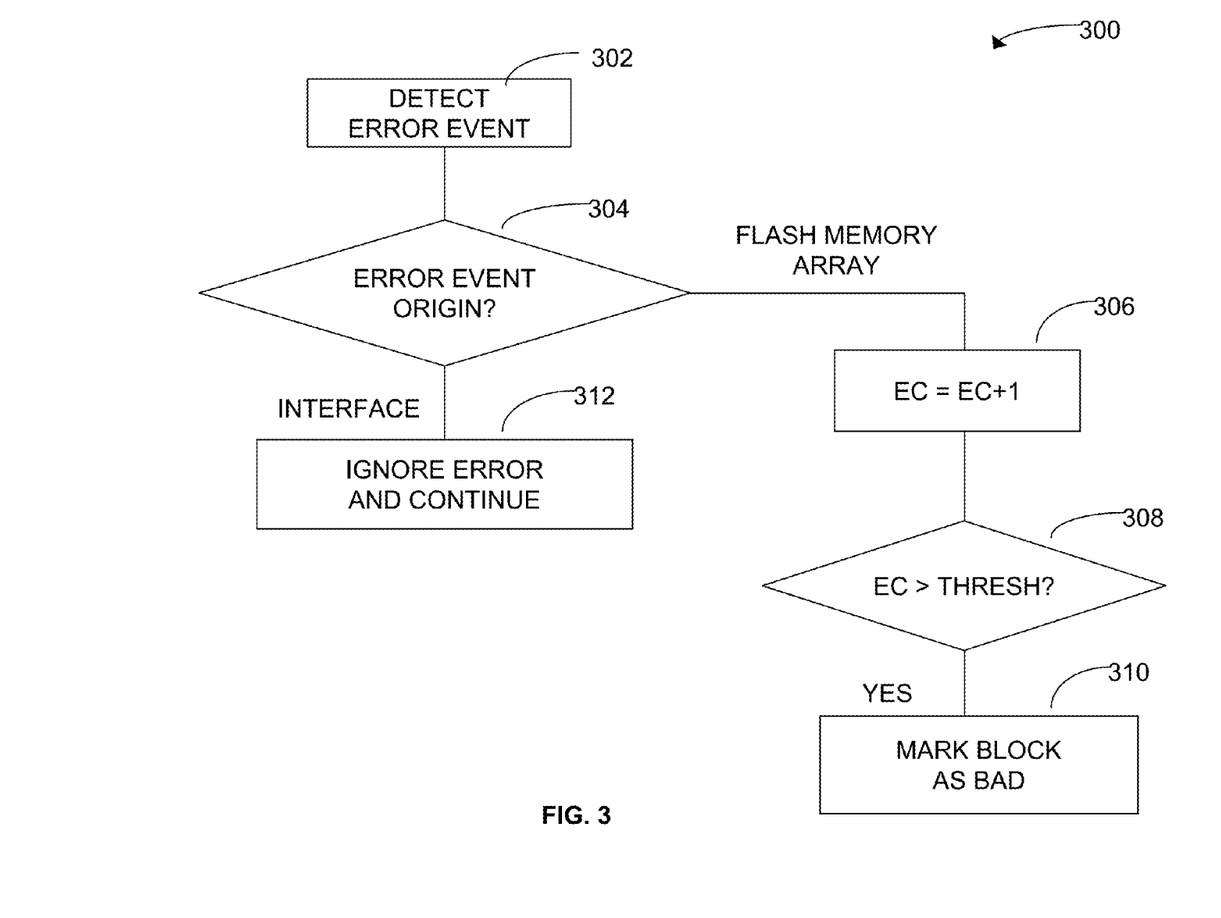
FIG. 3 illustrates a flow diagram of a process for responding to an error event in a flash memory system to account for transmission errors, according to some embodiments of the present disclosure.

FIG. 3 illustrates a flow diagram of a process 300 for responding to an error event in a flash memory system to account for transmission errors, according to some embodiments of the present disclosure. Process 300 applies to high-speed and low-speed interfaces. With reference to FIG. 1, error handling circuit 108 detects an error event associated with a block (step 302). Error handling circuit 108 determines the origin of the error event (step 304). If error handling circuit 108 determines the origin of the error event is memory array 104, memory controller 102 increments a total error count EC (step 306). If the total error count is greater than a threshold value THRESH (step 308), bad block manager 110 marks the associated block as bad and adds the associated block to a list of bad blocks that cannot be used for storage (step 310). As described above, marking the associated block as bad decreases the total available storage and the lifespan of flash memory system 100 by diminishing the overall memory capacity.

On the other hand, if error handling circuit 108 determines the origin of the error event is the interface, error handling circuit 108 ignores the error event and continues normal operation (step 312). Optionally, continuing the normal operation includes repeating a request for the underlying data. Accordingly, the present method increases the lifespan of flash memory system 100 because flash memory controller 102 avoids prematurely marking a good block as bad (step 310) in response to a transmission error.

Figure 4:
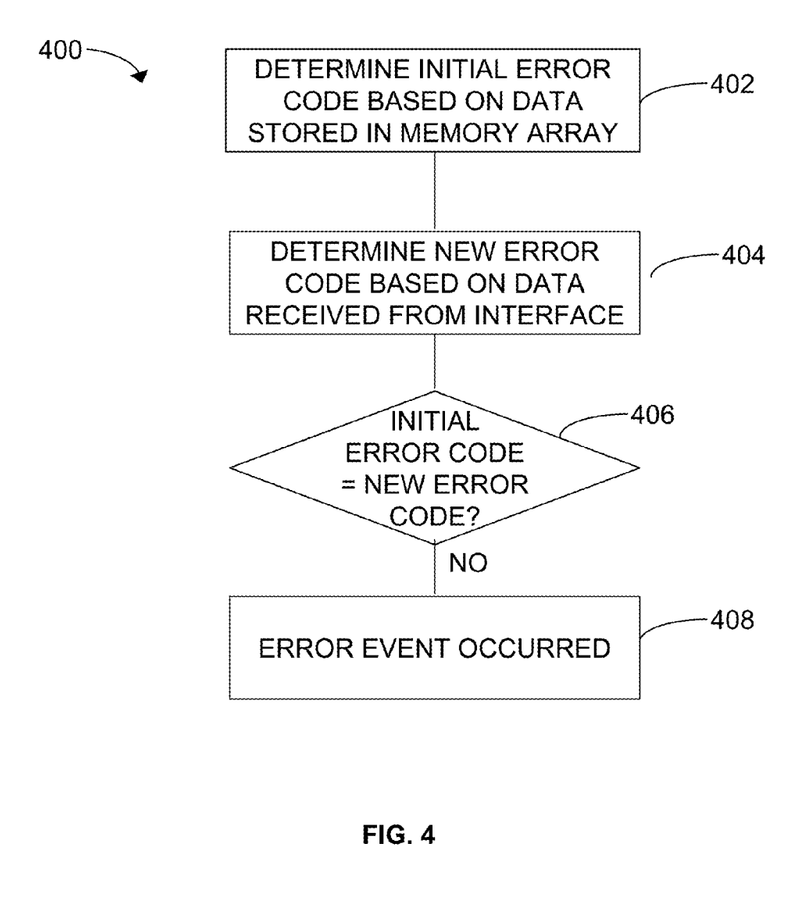
FIG. 4 illustrates a flow diagram of a process for detecting an error event in a flash memory system to account for transmission errors, according to some embodiments of the present disclosure.

FIG. 4 illustrates a flow diagram of a process 400 for detecting an error event in a flash memory system to account for transmission errors, according to some embodiments of the present disclosure. The present system can detect error events using a traditional error detection algorithm. Example error detection algorithms include a CRC (cyclic redundancy check) algorithm, repetition codes, Hamming codes, parity check codes, checksums, or hash functions. The present system determines an initial "error code" associated with the data stored in the memory array (step 402). An error code is similar to a digital "fingerprint." Later, if the data changes and the same error detection algorithm is rerun against the changed data, the error detection algorithm generates a different error code that does not match the original error code. Accordingly, one way to detect error events is to determine and store an error code along with requested data when memory controller 102 receives a write command to store data to memory array 104. The combination of the error code and the data is known as a "code word." Later, when flash memory controller 102 executes a read command from a host to read the stored data from memory array 104, error handling circuit 108 uses the error detection algorithm to generate a new error code based on the data received from interface 112 (step 404). Error handling circuit 108 detects an error event by comparing the new error code to the initial error code (step 406). If the new error code does not match the initial error code, then error handling circuit 108 detects that an error has occurred (step 408). Over a low-speed interface, the high transmission quality of the interface allows error handling circuit 108 to assume that a detected error event arose from a data error in an associated block in flash memory array 104, and not from a transmission error introduced by interface 202. Accordingly, error handling circuit 108 determines the error to be a data error.

Figure 5:
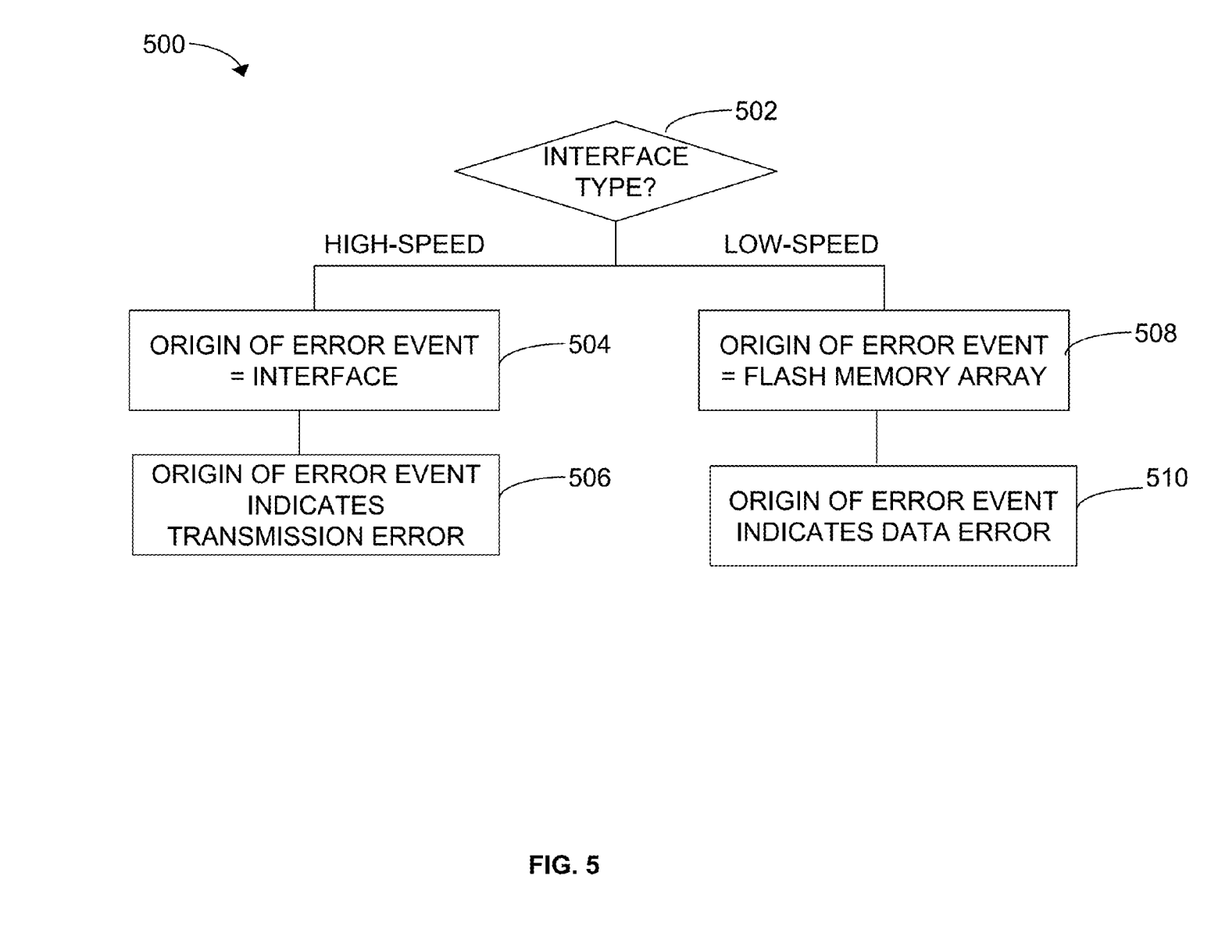
FIG. 5 illustrates a flow diagram of a process for determining an origin of an error event in a flash memory system to account for transmission errors, according to some embodiments of the present disclosure.

FIG. 5 illustrates a flow diagram of a process 500 for determining an origin of an error event in a flash memory system to account for transmission errors, according to some embodiments of the present disclosure. The error handling circuit determines the type of interface connecting flash memory controller 102 and flash memory array 104 (step 502). If the system has a high-speed interface, the error handling circuit determines that the origin of the error event is the interface (step 504). This determination indicates that the error event is a transmission error (step 506). If the system has a low-speed interface, the error handling circuit determines that the origin of the error event is the flash memory array (step 508). This determination indicates that the error event is a data error (step 510).

In an alternative embodiment, process 500 always determines the origin of an error event to be the interface. Accordingly, this determination always indicates that the error event is a transmission error. Thus, the present system is able to increase the lifespan of flash memory system 100 because flash memory controller 102 avoids erroneously and prematurely marking a good block as bad in response to a transmission error.

Figure 6:
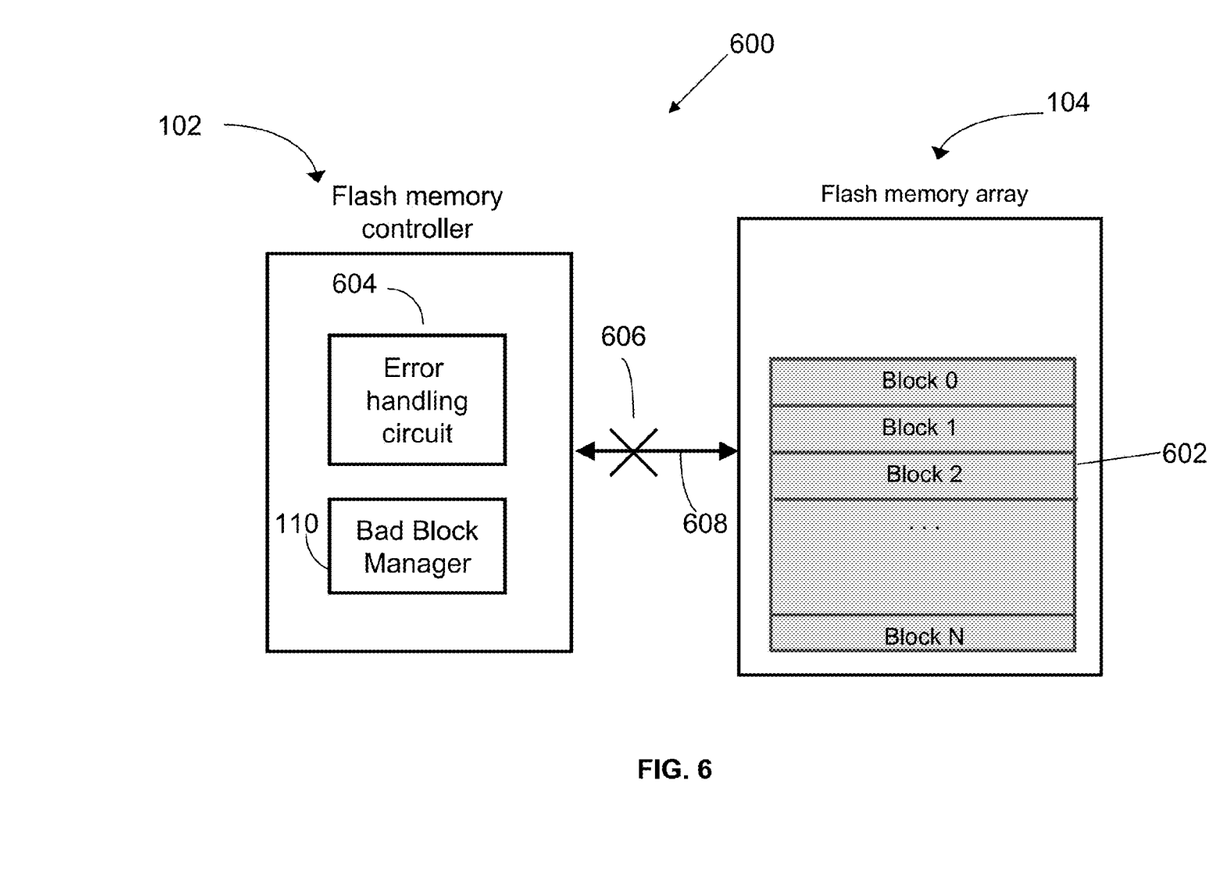
FIG. 6 illustrates a block diagram of a system for responding to an error event in a flash memory system to account for transmission errors, according to some embodiments of the present disclosure.

FIG. 6 illustrates a block diagram of a system 600 for responding to an error event in a flash memory system to account for transmission errors, according to some embodiments of the present disclosure. FIG. 6 includes, with reference to FIG. 1, flash memory controller 102, good block 602, error handling circuit 604 and bad block manager 110 in flash memory controller 102, and transmission error 606 on high-speed interface 608.

As described earlier, high-speed interfaces according to ONFI standards may transmit data at speeds up to 400 MB/s. A high-speed interface may, however, introduce an increased probability of transmission errors. Error handling circuit 604 is updated in embedded hardware, firmware, or software to support processes 300, 400, and 500 as illustrated in FIGS. 3-5. A transmission error can cause an error event that error handling circuit 604 detects. For example, when error handling circuit 604 receives a transmission of underlying data from good block 602 and an associated error code, error handling circuit 604 can detect an error event resulting from a transmission error 606 over high-speed interface 608 using the associated error code as illustrated in connection with FIG. 4, i.e., by comparing a computed or new error code with the initial error code in the codeword. Because the interface is high speed, error handling circuit 604 identifies the origin of the error event as high-speed interface 608. This indicates a transmission error and not an underlying data error in memory array 104, as illustrated in connection with FIG. 5. Accordingly, if error handling circuit 604 determines the origin of the error event is a transmission error, memory controller 102 does not increment the total error count, and instead continues normal operation, as illustrated in connection with FIG. 3. Otherwise, without the present flash memory system, a flash controller would erroneously mark a good block as bad even if an error event resulted from a transmission error over a high-speed interface. This false positive would erroneously lower the lifespan of the flash memory system by prematurely marking a good block as bad.

Optionally, error handling circuit 604 uses the associated error code to determine an appropriate correction for the error if the error is caused by the interface. Some error detection algorithms allow a system not only to detect an error event, but also to correct and reconstruct the underlying data based on the error code. Example error codes which provide error correction in addition to error detection include parity check codes, ARQ (automatic repeat request), convolutional codes, and block codes.

Figure 7:
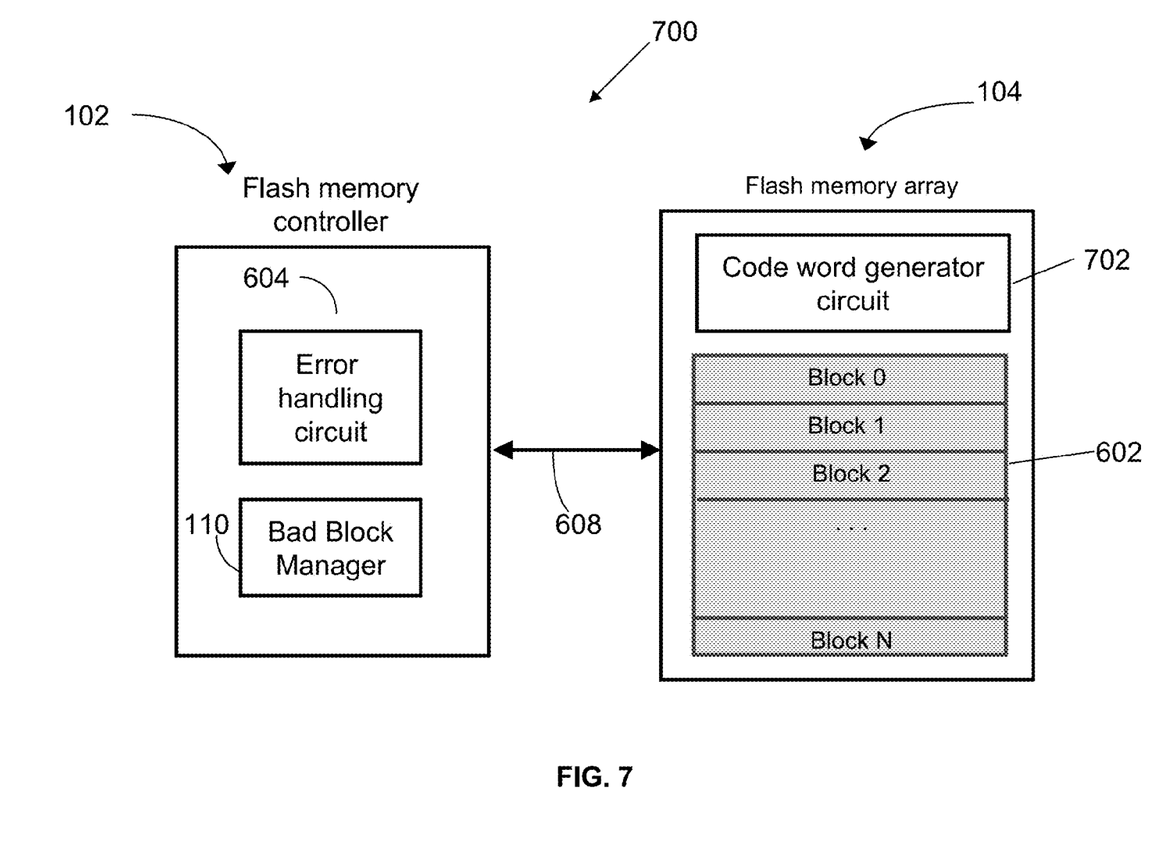
FIG. 7 illustrates a block diagram of a system for responding to an error event in a flash memory system to account for transmission errors using multiple error handling circuits to save storage capacity, according to some embodiments of the present disclosure.

FIG. 7 illustrates a block diagram of a system 700 for responding to an error event in a flash memory system to account for transmission errors using multiple error handling circuits to save storage capacity, according to some embodiments of the present disclosure. FIG. 7 includes, with reference to FIGS. 1 and 6, flash memory controller 102, flash memory array 704 with code word generator circuit 702, bad block manager 110, good block 602, error handling circuit 604, and high-speed interface 608. Flash memory controller 102 contains an embedded error handling circuit, and flash memory array 704 contains an embedded code word generator circuit to identify transmission errors. Flash memory controller 102 detects error events substantially as illustrated in FIG. 6. Additionally, flash memory array 704 saves storage capacity by storing only the underlying data, without the need to use additional storage for error codes associated with the underlying data. Instead, when flash memory controller 102 requests the data, code word generator circuit 702 determines and compares an error code associated with the underlying data. Error handling circuit 604 receives the underlying data and determines a new error code for the underlying data. If the two error codes match, the data was transmitted with no transmission errors. If the two error codes do not match, the system detects an error. Because the initial error code was generated after reading the data, the error is caused by a transmission error and not a read error. Accordingly, the error handling circuit 604 determines the error to be a transmission error. The savings in storage space on flash memory array 704 is offset by an increased requirement of time to calculate and to compare an error code for each time flash memory controller 102 requests the underlying data. Optionally, the system repeats a request for the data, in case the transmission error is transient and a repeated read would succeed in receiving the correct data.

Figure 8:
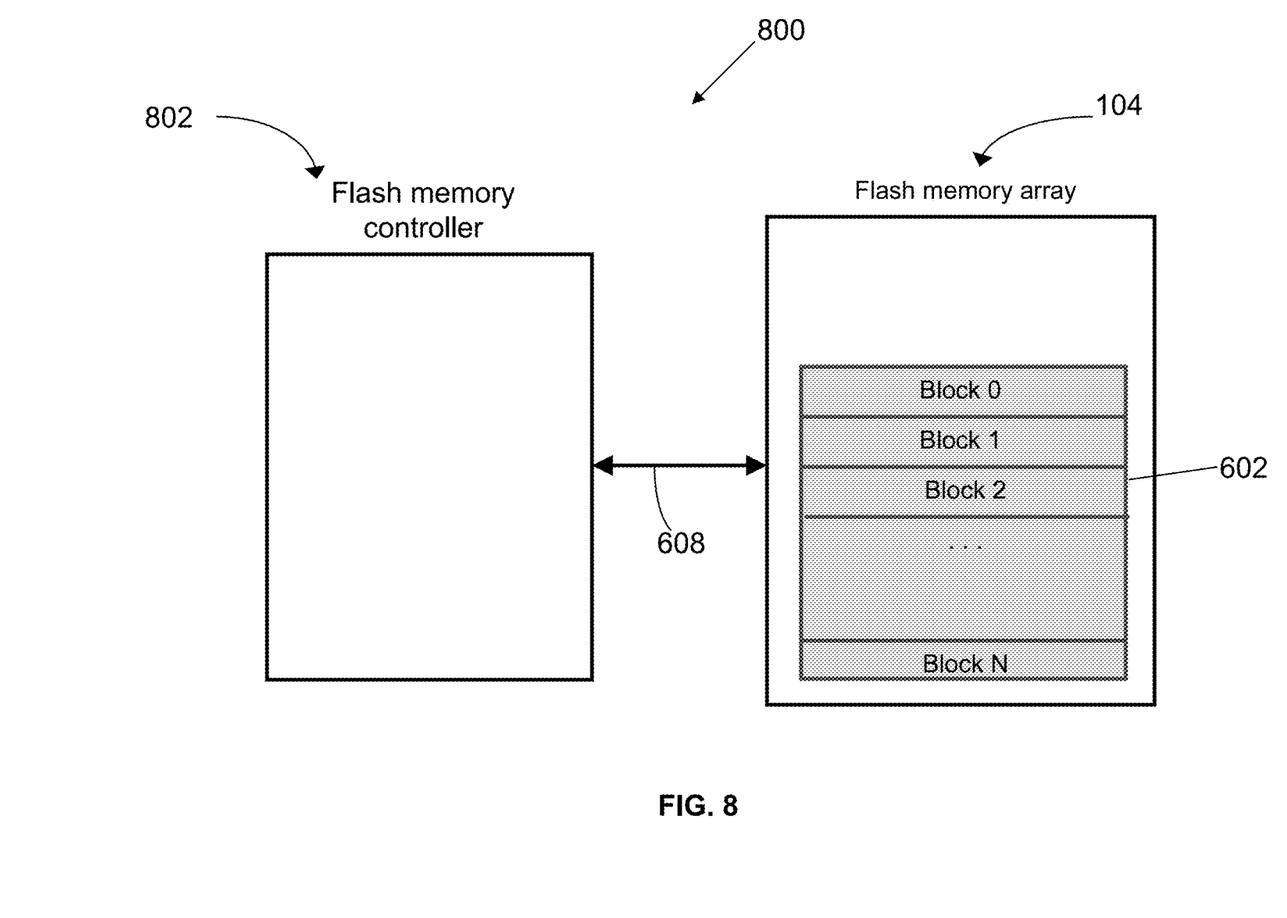
FIG. 8 illustrates a block diagram of a system for responding to an error event in a flash memory system to account for transmission errors using a memory controller while reducing the number of required circuits, according to some embodiments of the present disclosure.

FIG. 8 illustrates a block diagram for a system 800 of responding to an error event in a flash memory system to account for transmission errors using a memory controller while reducing the number of required circuits, according to some embodiments of the present disclosure. FIG. 8 includes, with reference to FIGS. 1 and 6, flash memory array 104, good block 602, high-speed interface 608, and flash memory controller 802. With reference to FIG. 6, FIG. 8 illustrates an embodiment in which memory controller 802 performs the functions of error handling circuit 604 and bad block manager 110, without requiring any dedicated hardware or firmware. In this embodiment, the features of the error handling circuit and the bad block manager are performed by software stored in memory on the flash memory controller.

While there have been shown and described examples of the present invention, it will be readily apparent to those skilled in the art that various changes and modifications may be made therein without departing from the scope of the invention.

What is claimed is:

1. A nonvolatile storage device for accounting for transmission errors to improve a usable life span of memory blocks, the storage device comprising:
    a memory array comprising a plurality of memory blocks;
    a memory controller; and
    an interface for the memory controller to communicate with the memory array, wherein the interface is one of a first type or a second type, the first type capable to transmit data at a speed of 50 megabytes per second (MB/s) or less, and the second type capable to transmit data at speeds greater than 50 MB/s,
    wherein the memory controller is configured to:
        detect an error event associated with data from one of the plurality of memory blocks received over the interface;
        determine a type of the interface to be one of the first type or the second type;
        if the interface is determined to be the first type, increment an error count, compare the error count to a threshold value, and mark the one of the plurality of memory blocks as unusable for nonvolatile storage when the error count exceeds the threshold value; and
        if the interface is determined to be the second type, ignore the error event and request retransmission of the data.

2. The storage device of claim 1, wherein the memory controller is configured to detect the error event by
    determining an initial error code based on said data from the one of the plurality of memory blocks;
    determining a new error code based on said data from the one of the plurality of memory blocks;
    comparing the new error code with the initial error code; and indicating that an error event occurred if the initial error code differs from the new error code.

3. The storage device of claim 2, wherein the memory controller is configured to store the initial error code with said data in the one of the plurality of memory blocks.

4. The storage device of claim 2, wherein the memory controller is configured to generate the initial error code when said data is requested to be read from the one of the plurality of memory blocks.

5. The storage device of claim 2, wherein the memory controller is configured to correct said data if the initial error code was created according to an error correction algorithm.

6. The storage device of claim 2, wherein the memory controller is configured to determine at least one of the initial error code and the new error code based on a cyclic redundancy check algorithm.

7. The storage device of claim 2, wherein the memory controller is configured to reconstruct said data if the initial error code was created according to an error correction algorithm.

8. The storage device of claim 1, wherein the interface of the second type is configured to transmit data at speeds greater than two hundred megabytes per second.

9. A method for accounting for transmission errors to improve a usable life span of memory blocks, the method comprising:
   detecting an error event associated with data transmitted via an interface from one of a plurality of memory blocks in a memory array;
   determining a type of the interface to be one of a first type or a second type, wherein the first type is capable to transmit data at a speed of 50 megabytes per second (MB/s) or less, and the second type is capable to transmit data at speeds greater than 50 MB/s;
   if the interface is determined to be the first type, incrementing an error count, comparing the error count to a threshold value and marking the one of the plurality of memory blocks as unusable for nonvolatile storage when the error count exceeds the threshold value; and
   if the interface is determined to be the second type, ignoring the error event and requesting retransmission of the data.

10. The method of claim 9, wherein the detecting the error event includes
   determining an initial error code based on said data from the one of the plurality of memory blocks;
   determining a new error code based on said data from the one of the plurality of memory blocks;
   comparing the new error code and the initial error code; and
   indicating that an error event occurred if the initial error code differs from the new error code.

11. The method of claim 10, wherein the initial error code is stored with said data in the one of the plurality of memory blocks.

12. The method of claim 10, wherein the initial error code is generated when said data is requested to be read from the one of the plurality of memory blocks.

13. The method of claim 10, further comprising correcting said data if the initial error code was created according to an error correction algorithm.

14. The method of claim 10, wherein at least one of the initial error code and the new error code is determined based on a cyclic redundancy check algorithm.

15. The method of claim 10, further comprising reconstructing said data if the initial error code was created according to an error correction algorithm.

16. The method of claim 9, wherein the interface of the second type is configured to transmit data at speeds greater than two hundred megabytes per second.

* * * * *